US010100435B2

(12) United States Patent
Noguchi et al.

(10) Patent No.: US 10,100,435 B2
(45) Date of Patent: Oct. 16, 2018

(54) METHOD FOR MANUFACTURING DIAMOND SUBSTRATE

(71) Applicants: SHIN-ETSU CHEMICAL CO., LTD., Tokyo (JP); NATIONAL INSTITUTE OF ADVANCED INDUSTRIAL SCIENCE AND TECHNOLOGY, Tokyo (JP); NATIONAL UNIVERSITY CORPORATION KANAZAWA UNIVERSITY

(72) Inventors: Hitoshi Noguchi, Takasaki (JP); Shozo Shirai, Takasaki (JP); Toshiharu Makino, Tsukuba (JP); Masahiko Ogura, Tsukuba (JP); Hiromitsu Kato, Tsukuba (JP); Hiroyuki Kawashima, Tsukuba (JP); Daisuke Kuwabara, Tsukuba (JP); Satoshi Yamasaki, Tsukuba (JP); Daisuke Takeuchi, Tsukuba (JP); Norio Tokuda, Kanazawa (JP); Takao Inokuma, Kanazawa (JP); Tsubasa Matsumoto, Kanazawa (JP)

(73) Assignees: SHIN-ETSU CHEMICAL CO., LTD., Tokyo (JP); NATIONAL INSTITUTE OF ADVANCED INDUSTRIAL SCIENCE AND TECHNOLOGY, Tokyo (JP); NATIONAL UNIVERSITY CORPORATION KANAZAWA UNIVERSITY, Kanazawa-shi (JP)

( * ) Notice: Subject to any disclaimer, the term of this patent is extended or adjusted under 35 U.S.C. 154(b) by 0 days.

(21) Appl. No.: 15/445,196

(22) Filed: Feb. 28, 2017

(65) Prior Publication Data

US 2017/0247814 A1 Aug. 31, 2017

(30) Foreign Application Priority Data

Feb. 29, 2016 (JP) ................................ 2016-037183

(51) Int. Cl.
*C30B 25/04* (2006.01)
*C30B 25/18* (2006.01)
(Continued)

(52) U.S. Cl.
CPC ............ *C30B 25/186* (2013.01); *C30B 25/04* (2013.01); *C30B 25/20* (2013.01); *C30B 29/04* (2013.01);
(Continued)

(58) Field of Classification Search
CPC .......... C30B 29/04; C30B 25/02; C30B 25/04
See application file for complete search history.

(56) References Cited

U.S. PATENT DOCUMENTS 5,711,698 A * 1/1998 Chakraborty ....... C04B 41/0054 451/41
2012/0047950 A1* 3/2012 Grotjohn ............. A44C 17/003 63/32

FOREIGN PATENT DOCUMENTS

CN 104651928 A 5/2015
EP 0745707 A1 12/1996
(Continued)

OTHER PUBLICATIONS

Kazuki et al. “Epitaxial Growth of Diamond on Iridium,” Jpn. J. Appl. Phys. vol. 35 (1996) pp. L 1072-L 1074 Part 2, No. 8B. Aug. 15, 1996.
(Continued)

*Primary Examiner* — Robert M Kunemund
(74) *Attorney, Agent, or Firm* — Oliff PLC

(57) ABSTRACT

The present invention provides a method for manufacturing a diamond substrate, including: a first step of preparing
(Continued)

patterned diamond on a foundation surface, a second step of removing a foreign substance adhered on a wall of the patterned diamond prepared in the first step, and a third step of growing diamond from the patterned diamond prepared in the first step to form the diamond in a pattern gap of the patterned diamond prepared in the first step. There can be provided a method for manufacturing a diamond substrate with few dislocation defects, in which generation of abnormal growth particles are suppressed.

7 Claims, 4 Drawing Sheets

(51) Int. Cl.

| | |
|---|---|
| ***C30B 25/20*** | (2006.01) |
| ***C30B 29/04*** | (2006.01) |
| ***H01L 29/16*** | (2006.01) |
| ***H01L 21/02*** | (2006.01) |

(52) U.S. Cl.
CPC .... *H01L 21/0262* (2013.01); *H01L 21/02376* (2013.01); *H01L 21/02527* (2013.01); *H01L 21/02658* (2013.01); *H01L 29/1602* (2013.01)

(56) References Cited

FOREIGN PATENT DOCUMENTS

| | | | |
|---|---|---|---|
| EP | 3181736 | A1 | 6/2017 |
| WO | 2016/024564 | A1 | 2/2016 |

OTHER PUBLICATIONS

Ichikawa et al. "Defect examination of epitaxial diamond by etch pit method: Effect of etching temperatureon etch pit formation." Proc. 24th_NDF-Dia.Sympo.226_2010.

Yamada et al. "A 2-in. mosaic wafer made of a single-crystal diamond." Applied Physics Letters vol. 104, pp. 102110 (2014) 1-4.

Umezawa et al. "Diamond & Related Materials." Diamond & Related Materials vol. 18 (2009) pp. 1196-1199.

Sawabe et al. "J.Jpn.Association for Crystal Growth." vol. 39, No. 4_179 (2012).

Jul. 13, 2017 Extended Search Report issued in European Patent Application No. 17000295.0.

* cited by examiner

METHOD FOR MANUFACTURING DIAMOND SUBSTRATE

TECHNICAL FIELD

The present invention relates to a method for manufacturing a diamond substrate.

BACKGROUND ART

Diamond has a wide band gap of 5.47 eV at room temperature, and is known as a wide bandgap semiconductor.

Among semiconductors, diamond has extremely high dielectric breakdown electric field strength of 10 MV/cm, and a high-voltage operation can be performed. Moreover, diamond has the highest thermal conductivity among known materials, and has an excellent heat radiation property thereby. Further, diamond has very large carrier mobility and saturated drift velocity, and is suitable for a high speed device.

Accordingly, diamond has the highest Johnson performance index, which indicates a property as a radio-frequency and high power device, compared to semiconductors such as silicon carbide and gallium nitride, and is said to be an ultimate semiconductor thereby.

As described above, diamond is expected to be practically used as a semiconductor. It has been desired to supply a large-area and high-quality diamond substrate. However, a diamond substrate with sufficient quality has not been obtained yet.

Currently, Ib type diamond synthesized by a High Pressure and High Temperature (HPHT) method is used as one of a diamond substrate. This Ib type diamond, however, contains many nitrogen impurities, and can only be obtained in a size of about 8 mm square at maximum, thereby being less practical.

Non-Patent Document 1 produces a Schottky diode by using diamond synthesized by a HPTP method as a substrate. This diamond substrate, however, has an etch-pit density by hydrogen plasma treatment, which is a measure of a dislocation defect density, of approximately $10^5$ $cm^{-2}$. This is reported to be causing operation failure when it is actually formed into an electrode and tried to operate since it contains a killer defect in the vicinity of the electrode or a current path.

In some cases, a homoepitaxial diamond, which was epitaxially grown by a Chemical Vapor Deposition (CVD) method using a diamond synthesized by a HPHT method as a foundation, is used as a substrate.

Non-Patent document 2 tried to produce a mosaic diamond substrate in which plural of diamond substrates are bound in order to obtain a large diamond substrate. Such an art, however, is liable to generate cracks along with the boundary of the substrate.

On the other hand, it has been investigated to produce a diamond substrate by heteroepitaxial growth, in which diamond is grown on the other material. By heteroepitaxial growth, it is possible to obtain a large-area substrate relatively easily, and to reduce the production cost.

As a foundation for heteroepitaxial growth of diamond, silicon (Si), platinum (Pt), etc. have been investigated previously. Non-Patent Document 3 reported that iridium (Ir) is suitable for the foundation material.

This is an art to use Ir epitaxially grown on the surface of a single crystal magnesium oxide (MgO) as a foundation material, to subject the surface to treatment for generating a diamond nuclei, and to produce epitaxial diamond by a direct current plasma CVD method.

In heteroepitaxial growth, however, many dislocation defects are generated due to lattice mismatch between diamond and the foundation material. For example, there is large lattice mismatch of 7% between diamond (lattice parameter: 3.57 Å) and Ir (lattice parameter: 3.84 Å). Non-Patent Document 4 reports that an etch-pit density of heteroepitaxial diamond rises to $10^8$ $cm^{-2}$.

As a method for reducing such a dislocation defect, Non-Patent Document 5 proposes an art called selective growth process. This is a process of lateral growth of diamond from diamond nuclei formed in arbitrary pattern (ELO: Epitaxial Lateral Overgrowth).

PRIOR ART DOCUMENTS

Non-Patent Documents

Non-Patent Document 1: H. Umezawa et al., Diamond Relat. Mater., 18, 1196 (2009)

Non-Patent Document 2: H. Yamada et al., Appl. Phys. Lett., 104, 102110 (2014)

Non-Patent Document 3: K. Ohtsuka et al., Jpn. J. Appl. Phys., 35, L1072 (1996)

Non-Patent Document 4: K. Ichikawa et al., Proc. 24th NDF-Dia. Sympo., 226 (2010)

Non-Patent Document 5: A. Sawabe et al., J. Jpn. Association for Crystal Growth, 39, 179 (2012)

SUMMARY OF INVENTION

Technical Problem

The foregoing selective growth process can reduce dislocation defects. However, it was found that the selective growth process is liable to generate abnormal growth particles when diamond is grown by this process.

When such abnormal growth particles are generated, the diamond substrate cannot be used as a substrate for a semiconductor device.

The present invention has been made in view of these circumstances, and it is an object of the present invention to provide a method for manufacturing a diamond substrate having few dislocation defects with the generation of abnormal growth particles being suppressed.

Solution to Problem

In order to solve the above problems, the present invention provides a method for manufacturing a diamond substrate, comprising:

a first step of preparing patterned diamond on a foundation surface, a second step of removing a foreign substance adhered on a wall of the patterned diamond prepared in the first step, and a third step of growing diamond from the patterned diamond prepared in the first step to form the diamond in a pattern gap of the patterned diamond prepared in the first step.

Such a method for manufacturing a diamond substrate can manufacture a diamond substrate having few dislocation defects with the generation of abnormal growth particles being suppressed.

In this case, the foundation surface can be composed of diamond.

When the foundation surface is composed of diamond, a diamond substrate can be manufactured by homoepitaxial growth.

The foundation surface can be composed of a different kind of material other than diamond such as iridium, rhodium, and platinum.

When the foundation surface is composed of different kind of material, and diamond is heteroepitaxially grown as described above, it is possible to manufacture a high-quality and large-area diamond substrate.

It is also preferable that the foreign substance adhered on the wall of the patterned diamond be removed by using $CF_4$ plasma in the second step.

The use of $CF_4$ plasma as described above can selectively remove only foreign substances adhered on the wall of the patterned diamond such as Ir and $SiO_2$, and is preferable thereby.

It is also preferable that the patterned diamond be prepared in the first step with a ratio D/W of a depth D to a width W of the pattern gap being 0.1 or more.

This causes the pattern gap to be filled relatively early in the third step. Accordingly, even when an abnormal growth particle is generated from the pattern gap, an influence to the formed diamond surface can be reduced.

It is also preferable that the patterned diamond be prepared in the first step with at least a part of a bottom portion of the pattern gap being pierced through.

When the foundation surface is composed of a different kind of material other than diamond, the patterned diamond may also be prepared in the first step with at least a part of a bottom portion of the pattern gap being prepared below the foundation surface.

This makes it possible to relax internal stress and thermal stress, which is created when the foundation is composed of a different kind of material.

It is also preferable in the third step that the diamond be grown by using a chemical vapor deposition method.

As described above, in the third step, diamond can be grown by using various chemical vapor deposition methods.

It is also preferable to form a void in the diamond grown in the third step.

By forming such a void as described above, it is possible to relax the stress, especially the thermal stress, which is created when the foundation is composed of a different kind of material, and is preferable thereby.

Advantageous Effects of Invention

The present invention can provide a diamond substrate having few dislocation defects with the generation of abnormal growth particles being suppressed. When a different kind of material is used for the foundation to heteroepitaxially grow diamond, it is also possible to enlarge the area of a diamond substrate.

DESCRIPTION OF EMBODIMENTS

As described above, the inventors have realized that diamond growth by the selective growth process can certainly reduce dislocation defects, but is liable to generate abnormal growth particles.

The inventors have further investigated to determine that it is caused by foreign substances adhered on the wall of the patterned diamond. They have also found that it is possible to manufacture a diamond substrate having few dislocation defects with the generation of abnormal growth particles being suppressed by removing the foreign substance adhered on the wall of the patterned diamond before growing diamond by the selective growth process.

That is, the present invention provides a method for manufacturing a diamond substrate, comprising:

a first step of preparing patterned diamond on a foundation surface, a second step of removing a foreign substance adhered on a wall of the patterned diamond prepared in the first step, and a third step of growing diamond from the patterned diamond prepared in the first step to form the diamond in a pattern gap of the patterned diamond prepared in the first step.

Hereinafter, the embodiments of the present invention will be described with referring to Figures, but the present invention is not limited thereto. The inventive method for manufacturing a diamond substrate includes at least three steps described below, but another step can be added as needed.

Figure 1:
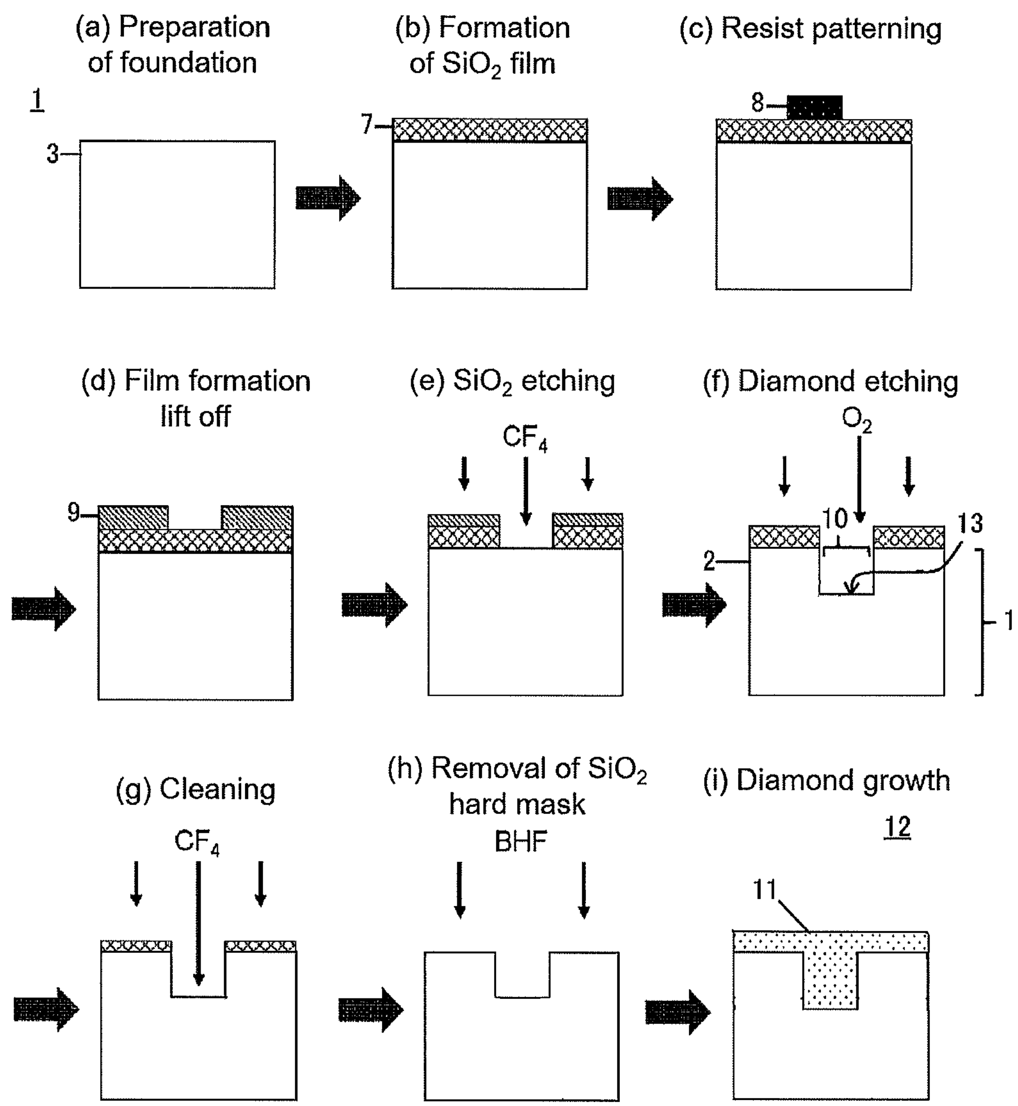
FIG. 1 is a schematic view showing an example (Example 2) of a method for manufacturing a diamond substrate of the present invention.
Figure 2:
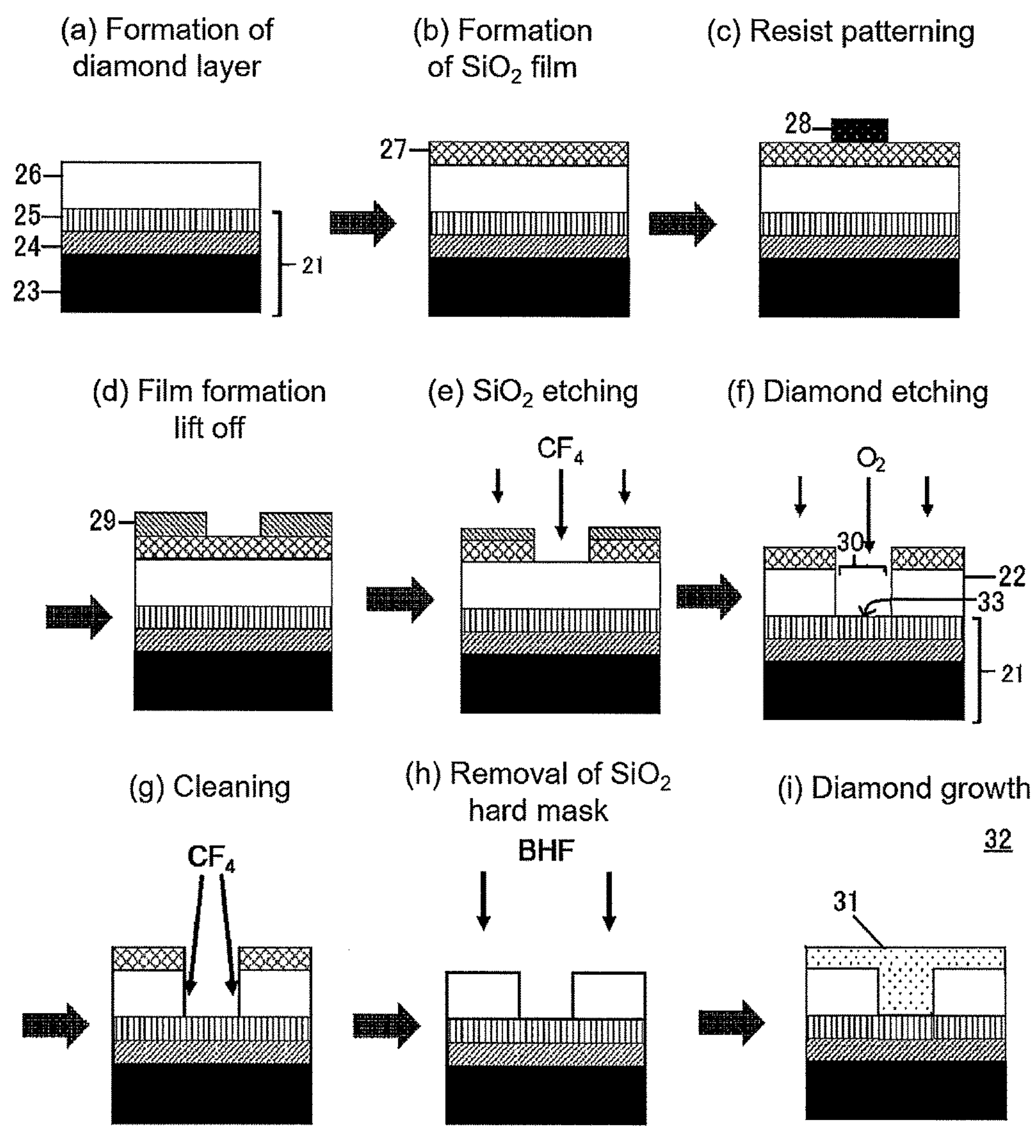
FIG. 2 is a schematic view showing an example (in Examples 1 and 3) of another method for manufacturing a diamond substrate of the present invention.

In the first step, patterned diamond 2 or 22 is prepared on the surface of the foundation 1 or 21 (FIG. 1 (*a*) to (*f*), FIG. 2 (*a*) to (*f*)). The material to compose the foundation 1 and 21 is not particularly limited. When the foundation surface is composed of diamond, a diamond substrate is manufactured by homoepitaxial growth.

Illustrative examples of such a foundation 1 include diamond 3 such as diamond synthesized by an HPHT method, homoepitaxial diamond, and heteroepitaxial diamond. Particularly, a diamond substrate with even fewer defects can be manufactured when diamond 3 which contain relatively few defects, such as diamond synthesized by an HPHT method and homoepitaxial diamond, is used as a foundation 1.

On the other hand, the foundation surface is composed of a different kind of material other than diamond, a diamond substrate is manufactured by heteroepitaxial growth.

As the different kind of material for composing the foundation surface, it is preferable that the material be a cubic crystal like diamond, have small lattice mismatch with diamond, and do not form carbide through reaction with carbon. Illustrative examples of the material to meet these conditions include platinum group such as rhodium (Rh), palladium (Pd), iridium (Ir), and platinum (Pt).

Incidentally, the lattice parameter of diamond is 3.57 Å, and accordingly, the lattice mismatch with Rh (lattice parameter: 3.72 Å) is 4.2%, the lattice mismatch with Ir (lattice parameter: 3.84 Å) is 7.6%, and the lattice mismatch with Pt (lattice parameter: 3.92 Å) is 9.8%. It is preferable that the lattice mismatch between diamond and the different kind of material composing the foundation is 10% or less. In view of not forming carbide through reaction with carbon, Ir is preferable.

Illustrative examples of the foundation 21 include a foundation 21 in which the middle layer 24 composed of material selected from single crystal magnesium oxide (MgO), single crystal strontium titanate ($SrTiO_3$), α-alumina ($Al_2O_3$), and yttria-stabilized zirconia (YSZ) is prepared on the silicon (Si) substrate 23; and the top layer 25 composed of material selected from iridium (Ir), rhodium (Rh), and platinum (Pt) is prepared on the middle layer 24.

It is also possible to intervene one or more layers (not shown in FIGs.) composed of material selected from gold (Au), platinum (Pt), titanium (Ti), chromium (Cr), iridium (Ir), rhodium (Rh), silicon (Si), and silicon oxide ($SiO_2$) between the silicon (Si) substrate 23 and the middle layer 24.

It is possible to obtain a large-area diamond substrate easily and at relatively low cost by heteroepitaxial growth. Accordingly, when heteroepitaxial growth is applied to the present invention, a high-quality and large-area diamond substrate can be manufactured.

The method for preparing the patterned diamond on the foundation surface is not limited either. Incidentally, "patterned" in the present invention means a pattern formed of ruggedness.

When the foundation surface is composed of diamond as shown in FIG. 1, diamond of the foundation surface can be processed into patterned diamond, for example, by a known method such as photolithography and electron beam lithography. Specifically, it is possible to prepare patterned diamond on a foundation surface by the following processes.

First, the diamond substrate 3 is prepared as the foundation 1 (FIG. 1 (*a*)). Then, onto the diamond substrate 3, an $SiO_2$ film 7 is formed (FIG. 1 (*b*)). Onto this $SiO_2$ film 7, a resist pattern 8 is formed (FIG. 1 (*c*)). Subsequently, onto the $SiO_2$ film 7 on which the resist pattern 8 is formed, a titanium (Ti) film and a gold (Au) film are formed successively and subjected to liftoff, thereby forming the $SiO_2$ film 7 and the titanium (Ti)/gold (Au) pattern 9 successively on the diamond substrate 3 (FIG. 1 (*d*)). Then, $SiO_2$ etching is performed by using $CF_4$ gas to make the remaining $SiO_2$ film be a hard mask for diamond etching (FIG. 1 (*e*)).

Using thus obtained hard mask composed of $SiO_2$ to etch the diamond by $O_2$ gas, the patterned diamond 2 can be prepared on the surface of the foundation 1 (FIG. 1 (*f*)).

When the foundation is composed of a different kind of material as shown in FIG. 2, first, diamond 26 is grown on the surface of the foundation 21 by a known method such as microwave plasma CVD, direct current plasma CVD, hot-filament CVD, and arc discharge plasma jet CVD (FIG. 2 (*a*)).

Then, the diamond 26 grown on the foundation surface is processed to have a patterned shape by a method such as photolithography and electron beam lithography, and the patterned diamond can be prepared on the foundation surface thereby. Specifically, the patterned diamond can be prepared on the foundation surface by the following processes.

On the grown diamond layer 26, an $SiO_2$ film 27 is formed (FIG. 2 (*b*)). Onto this $SiO_2$ film 27, a resist pattern 28 is formed (FIG. 2 (*c*)). Subsequently, onto the $SiO_2$ film 27 on which the resist pattern 28 is formed, a titanium (Ti) film and a gold (Au) film are formed successively and subjected to liftoff, thereby forming the $SiO_2$ film 27 and the titanium (Ti)/gold (Au) pattern 29 successively on the diamond layer 26 (FIG. 2 (*d*)). Then, $SiO_2$ etching was performed by using $CF_4$ gas to make the remaining $SiO_2$ film be a hard mask for diamond etching (FIG. 2 (*e*)).

Using thus obtained hard mask composed of $SiO_2$ to etch the diamond layer by $O_2$ gas, the patterned diamond 22 can be prepared on the surface of the foundation 21 (FIG. 2 (*f*)).

Even when the foundation surface is composed of diamond, it is also possible to grow diamond on the foundation surface by the same process, and to process the grown diamond to a patterned shape to prepare patterned diamond on the foundation surface.

It is possible to select any pattern shape prepared on a foundation surface. For example, it can be a pattern in which plural of diamonds each having line shape, rectangular dot shape, circular dot shape, etc. are arranged.

In this case, it is also possible to select any position, any size, any thickness, and any crystal orientation of each patterned diamond 2 and 22. However, it is preferable that the ratio D/W of a depth D to a width W of each pattern gap 10 and 30 be 0.1 or more, more preferably 0.5 or more. This makes it possible to fill each pattern gaps 10 and 30 relatively early in the second step. Accordingly, even when an abnormal growth particle is slightly generated from the pattern gap 10 and 30, it is possible to decrease the influence on the formed diamond surface. Incidentally, "pattern gap" in the present invention means a gap between the convex portions of patterned diamond.

The bottom portions 13 and 33 of the pattern gaps 10 and 30 may be composed of diamond or a different kind of material. Materials such as MgO, however, are etched by hydrogen ($H_2$)/methane ($CH_4$) plasma of CVD when diamond is formed in the pattern gap 10 or 30 in the third step. Accordingly, materials such as Ir are preferable.

If necessary, at least a part of each bottom portion 13 and 33, which are bottoms of the pattern gaps 10 and 30 of the patterned diamond 2 and 22 prepared in the first step, may be removed together with the foundation, and may be pierced through thereby.

When the foundation surface is composed of a different kind of material other than diamond, at least a part of the bottom portions 33, which are bottoms of the pattern gaps 30 of the patterned diamond 22 prepared in the first step, may be prepared below the foundation surface, by removing a part of the foundation too. In this case, it is possible to determine any value as the depth from each foundation surface to each bottom portion 33 of the pattern gaps 30.

This makes it possible to relax internal stress and thermal stress, which is created when the foundation is composed of a different kind of material. As a method to remove the bottom portion together with the foundation, etching can be mentioned, for example.

The second step involves removing a foreign substance adhered on a wall of the patterned diamond 2 or 22 prepared in the first step (FIG. 1 (*g*), FIG. 2 (*g*)). The foreign substance adhered on a wall of the patterned diamond can cause to generate an abnormal growth particle in the third step.

Particularly, when the bottom portion of a patterned gap is composed of a different kind of material, the foreign substance can adhere onto the diamond wall in a step of processing the diamond into a patterned shape.

When the bottom portion of a patterned gap is composed of diamond, there also arises a risk in which material of a hard mask such as $SiO_2$ can adhere onto the diamond wall in case of processing the diamond into a patterned shape by etching, for example.

The method of removing a foreign substance adhered on a wall of the patterned diamond 2 or 22 is not limited, and the foreign substance can be removed by dry etching or wet etching. However, it is preferable to use a method which can selectively remove only the foreign substance adhered on a diamond wall.

For example, when Ir and/or $SiO_2$ is adhering on the wall of the patterned diamond 2 or 22, use of $CF_4$ plasma makes it possible to remove only Ir and/or $SiO_2$ by etching without etching the diamond.

Subsequently, it is also possible to remove or clean the hard mask such as $SiO_2$ if necessary (FIG. 1 (*h*), FIG. 2 (*h*)).

The third step involves growing diamond from the patterned diamond prepared in the first step to form the diamond 11 or 31 in a pattern gap 10 or 30 of the patterned diamond prepared in the first step (FIG. 1 (*i*), FIG. 2 (*i*)).

The method for growing the diamond from the patterned diamond 2 or 22 prepared in the first step can be selected from a known method such as microwave plasma CVD, direct current plasma CVD, hot-filament CVD, and arc discharge plasma jet CVD.

In this case, diamond is laterally grown from the patterned diamond 2 or 22 as a nucleus (ELO: Epitaxial Lateral Overgrowth). Accordingly, diamond 11 or 31 with few defects can be formed in the pattern gap 10 or 30.

The diamond does not have to be formed so as to fill the whole pattern gaps 10 or 30.

When the diamond is grown in the third step in such a way that the growth rate from the upper portion of the patterned diamond is faster than that from the lower portion thereof, a void can be formed in the bottom portion of the pattern gap 10 or 30. Forming such a void can relax stress, especially thermal stress created when the foundation is composed of a different kind of material, and is preferable thereby. The void to be formed can be a void having a nearly triangle shape cross-section of a side 0.01 to 20 μm, for example.

As a specific method for adjusting the growth rate at the lower portion and the upper portion of the patterned diamond, it is possible to adjust the concentration and pressure of source gas (e.g., methane), input power, etc. to adjust the ratio of the growth rates in respective crystal orientations.

The present invention can manufacture the diamond substrate 12 and 32 in which a part of the surface is composed of lateral grown diamond and/or diamond grown from the lateral grown diamond while suppressing generation of abnormal growth particles through the first step to the third step.

In the present invention, it is also possible to repeat forming, cleaning, and growing of the patterned diamond according to the first step to the third step for plural times to manufacture the diamond substrate in which the whole surface is composed of lateral grown diamond and/or diamond grown from the lateral grown diamond.

It is also possible to further reduce the defects by forming the whole surface from a lateral grown diamond and/or diamond grown from the lateral grown diamond, followed by repeating the formation and growth of patterned diamond according to the first step to the third step for plural times. This process can form more voids, and lower stress can be expected thereby.

The diamond substrate manufactured by the present invention may be used with the foundation being remained, or may be used as a freestanding substrate with the foundation being removed.

When the foundation of a diamond substrate is removed to produce a freestanding substrate, the thickness of the freestanding substrate is preferably 50 μm or more and 2000 μm or less. The freestanding substrate with a thickness of 50 μm or more is easy to be handled and does not have a risk of breakage in its production process or in a device production process using the diamond substrate, and is preferable thereby.

On the other hand, when the thickness of the freestanding substrate is 2000 μm or less, the time for forming the diamond does not become longer in itself, and the time for polishing process can be shortened since the surface of the diamond substrate does not have large ruggedness. Accordingly, the production cost can be reduced. It is also possible to suppress warpage of the substrate, and to suppress generation of a crack and breakage.

When the foundation of the diamond substrate is remained to make a substrate structure including the foundation, the diamond layer does not have to be formed needlessly thick. Considering the time for manufacturing the diamond substrate and the influence of internal stress, it is preferable that the thickness from the foundation surface to the surface of the substrate be 300 μm or less.

When a void is formed on the bottom portion of a pattern gap 10 or 30 in the third step, it is possible to obtain a diamond substrate which contains a void in the inner portion of the substrate. When the foundation is removed to make a freestanding substrate, a diamond substrate comprising a void in one surface thereof can be obtained.

When the bottom portion of the pattern gap 10 or 30 is at least partly pierced of the patterned diamond prepared in the first step, it is possible to obtain a diamond substrate which comprises an opening on the one surface (the back surface) thereof.

Such a diamond substrate having a void or an opening in its inner portion or on the surface (the back surface) thereof can reduce the thermal stress. Accordingly, it is possible to suppress warpage of the substrate and generation of a crack.

It is preferable that the surface of a diamond substrate manufactured by the present invention is composed of single crystal diamond.

Onto the surface of a diamond substrate manufactured by the present invention, it is also possible to laminate a material selected from any of p-type diamond doped with an impurity such as boron (B), n-type diamond doped with an impurity such as phosphorous (P), diamond without being doped. Such a structure makes it possible to operate the substrate as a semiconductor device.

EXAMPLES

Hereinafter, the present invention will be specifically described using Examples of the present invention and a Comparative Example, but the present invention is not limited thereto.

Example 1

A diamond substrate was manufactured by the method shown in FIG. 2.

First, a foundation 21 was manufactured, and a diamond layer 26 was formed onto the foundation 21 as follows (FIG. 2 (*a*)).

A double-side polished single crystal silicon (Si) substrate 23 having a diameter of 10.0 mm and a thickness of 1.0 mm, with the surface having a (100) plane, was prepared. On the one side of the prepared single crystal silicon substrate 23, a layer 24 composed of single crystal MgO was formed by electron beam deposition. In this case, the single crystal MgO layer 24 was epitaxially grown until the thickness reached to 1 μm under the conditions of 900° C. of the substrate temperature in vacuum. On this single crystal MgO layer 24, a layer 25 composed of Ir was formed. The Ir layer 25 was formed by using a radio-frequency (RF) magnetron sputtering method (13.56 MHz) with targeting at Ir having a diameter of 6 inches (150 mm), a thickness of 5.0 mm, and purity of 99.9% or higher. The substrate on which the single crystal MgO layer 24 had been formed was heated to 800° C., and after it was confirmed that a base pressure became $6\times10^{-7}$ Torr (about $8.0\times10^{-5}$ Pa) or lower, 10 sccm of Ar gas was introduced. After the pressure became $5\times10^{-2}$ Torr (about 6.7 Pa) by adjusting aperture of a valve connected to an exhaust system, film formation was performed for 15 minutes by inputting RF power of 1000 W. The obtained Ir layer 25 had a thickness of 0.7 μm.

Thus obtained laminate, in which the single crystal MgO layer 24 and the Ir layer 25 had been laminated on the single crystal silicon substrate 23, was used as the foundation 21 in Example 1.

Then, the foundation 21 was subjected to pre-treatment (bias treatment) in order to form diamond nuclei. The foundation 21 was set on a planar electrode having a diameter of 15 mm, with the Ir layer 25 side facing upwards. After it was confirmed that the base pressure became $1\times10^{-6}$ Torr (about $1.3\times10^{-4}$ Pa) or lower, 500 sccm of hydrogen-diluted methane ($CH_4/(CH_4+H_2)$=5.0 vol. %) was introduced. After the pressure became 100 Torr (about $1.3\times10^{4}$ Pa) by adjusting aperture of the valve connected to the exhaust system, a negative voltage was applied to an electrode at the substrate side to expose the foundation to plasma for 90 seconds, and thereby the surface of the foundation was subjected to bias treatment.

Subsequently, a diamond layer 26 was heteroepitaxially grown on the foundation surface using a direct current plasma CVD method. The bias-treated foundation was set inside a chamber of a direct current plasma CVD apparatus, and after exhausting was performed using a rotary pump until the base pressure became $10^{-3}$ Torr (about $1.3\times10^{-1}$ Pa) or lower, 1000 sccm of hydrogen-diluted methane ($CH_4/(CH_4+H_2)$=5.0 vol. %) was introduced as a source gas. After the pressure inside the chamber became 110 Torr (about $1.5\times10^{4}$ Pa) by adjusting aperture of the valve connected to the exhaust system, film formation was performed for 2 hours by sending a direct current of 2.0 A. The temperature of the foundation during film formation, which was measured by a pyrometer, was 950° C.

The obtained diamond layer 26 was a complete continuous film which did not have delamination on the whole surface of the substrate with a diameter of 10 mm, and had a film thickness of 10 μm. This diamond layer was measured by X-ray diffraction (an incident X-ray wavelength of 1.54 Å) to reveal that the rocking curve half value width of the diffracted intensity peak at 2θ=119.5°, assigned to diamond (004), was 720 arcsec (about 0.2θ).

The etch-pit density was also evaluated. The surface of the diamond layer 26 was subjected to plasma treatment under the conditions of $H_2$ gas 100 vol. %. 0.8 Pa, 2200 W, and 1 hour by using a microwave (2.45 GHz) plasma CVD apparatus, and then the etch-pit density was measured by SEM observation to be $8\times10^{8}$ ($cm^{-2}$).

Then, the diamond layer 26 was subjected to patterning. First, 1000 nm of $SiO_2$ film 27 was formed on the diamond layer by an RF plasma CVD method using tetraethyl orthosilicate (TEOS) as a raw material (FIG. 2 (*b*)). Onto this $SiO_2$ film 27, a resist pattern 28 was formed (FIG. 2 (*c*)). Subsequently, onto the $SiO_2$ film 27 on which the resist pattern 28 had been formed, a titanium (Ti) film and a gold (Au) film were formed successively and subjected to liftoff, thereby forming the $SiO_2$ film 27 and the titanium (Ti)/gold (Au) pattern 29 successively on the diamond layer 26 (FIG. 2 (*d*)). Then, $SiO_2$ etching was performed by using $CF_4$ gas to make a hard mask for diamond etching (FIG. 2 (*e*)).

The diamond layer was etched under the conditions of $O_2$ gas 100 vol. %, 2.0 Pa, 500 W, and 900 seconds by using an induced combination plasma etching equipment to prepare the patterned diamond 22 on the surface of the foundation 21 (FIG. 2 (*f*)). Incidentally, the procedures described to this part corresponds to the first step in the present invention.

In this case, the patterned diamond 22 had a pattern in which 50 μm square rectangular dot diamonds were arranged, and the width W of the pattern gap 30 was 70 μm. In other words, this was a pattern in which plural grooves were provided in parallel with each other on the diamond layer, and other plural grooves being in parallel with each other were provided perpendicular to the foregoing grooves. The directions of the grooves were two directions which were perpendicular with each other, and one of them was the same direction with the [011] orientation of the diamond layer.

The depth D of the pattern gap 30 was 10 μm, and the ratio (D/W) of the depth D to the width W of the pattern gap 30 was 0.14 in this case. The bottom portion 33 of the pattern gap 30 was in a state in which Ir of the foundation was exposed.

Then, the obtained patterned diamond 22 was cleaned by plasma treatment as the step 2 (FIG. 2 (*g*)). The treatment was performed under the conditions of $CF_4$ gas 100 vol. %, 2.0 Pa, 500 W, and 650 seconds by using an induced combination plasma etching equipment. This procedure could remove foreign substances probably due to Ir adhered on the wall of the patterned diamond.

After the cleaning, the hard mask of $SiO_2$ was removed with buffered hydrofluoric acid, and cleaned with a thermal mixed acid (FIG. 2 (*h*)).

Next, as the third step, the diamond was grown from the patterned diamond 22, which had been prepared on the foundation surface, by a microwave plasma CVD method to form the diamond 31 in the pattern gap 30 of the patterned diamond prepared in the first step (FIG. 2 (*i*)).

The substrate provided with the patterned diamond 22 was set inside a chamber of a microwave plasma CVD apparatus, and after exhausting was performed using a rotary pump and a turbo molecular pump until the pressure became $7\times10^{-8}$ Torr (about $9.3\times10^{-6}$ Pa), 500 sccm of hydrogen-diluted methane ($CH_4/(CH_4+H_2)$=5.0 vol. %) was introduced as a source gas. After the pressure inside the chamber became 110 Torr (about $1.5\times10^{4}$ Pa) by adjusting aperture of the valve connected to the exhaust system, film formation was performed for 18 hours by applying microwave power of 3000 W. The temperature of the substrate during film formation, which was measured by a pyrometer, was 1035° C.

In the obtained diamond layer, the pattern gaps were filled. In this case, the thickness from the foundation surface to the surface of the substrate was 103 μm. This diamond layer was measured by X-ray diffraction (an incident X-ray wavelength of 1.54 Å) to reveal that the rocking curve half value width of the diffracted intensity peak at 2θ=119.5°, assigned to diamond (004), was 340 arcsec (about 0.1°).

The etch-pit density was also evaluated. The surface of the diamond layer was subjected to plasma treatment under the conditions of $H_2$ gas 100 vol. %. 0.8 Pa, 2200 W, and 1 hour by using a microwave (2.45 GHz) plasma CVD apparatus. Then, the etch-pit densities were measured by SEM observation, and found that the portion grown on the patterned diamond showed $1\times10^{8}$ ($cm^{-2}$), on the other hand, the portion of the pattern gap showed $3\times10^6$ ($cm^{-2}$), that is, the etch-pit density was decreased about two orders of magnitude.

On SEM observation of the cross section of the manufactured diamond substrate 32, a void having a nearly triangle shape cross-section with a side of 5 μm was observed in the vicinity of the center of the portion where had been the patterned gap, in such a way that it touched with the boundary between the Ir layer and the diamond layer.

In order to evaluate the stress of the diamond substrate 32, the change of warpage of the back surface of the substrate before and after the formation of the diamond layer was measured by using an optical interference or a contact type measuring device.

Subsequently, this measured value was divided by an increment of the film thickness before and after the formation of the diamond layer, and the calculated value was defined to the evaluation value of stress of the diamond substrate. The evaluation value in this case was $21\times10^{-2}$.

Then, the surface of the obtained diamond substrate 32 was polished. After the polishing, the thickness from the foundation surface to the surface of the substrate was 71 μm, and the surface roughness RMS was 0.3 nm (AFM measurement, in a region of 10 μm square).

Subsequently, the second patterning of the diamond layer was performed by the same process as in the first patterning. The pattern shape in this case was a pattern in which 50 μm square rectangular dot diamonds were arranged, and the width W of the pattern gap was 70 μm as in the shape of the first pattern. Provided that, the position of the pattern was translated in parallel along the [011] orientation of the diamond layer by 60 μm with respect to the first pattern. That is, in this case, the diamond formed in the second step was removed to a position which was 10 μm away from the boundary with the patterned diamond prepared in the first step.

Then, diamond was grown from the patterned diamond by using the same method as in growing the diamond from the patterned diamond prepared on the foundation surface.

In the obtained diamond layer, the pattern gaps were filled. In this case, the thickness from the foundation surface to the surface of the substrate was 164 μm. This diamond layer was measured by X-ray diffraction (an incident X-ray wavelength of 1.54 Å) to reveal that the rocking curve half value width of the diffracted intensity peak at $2\theta=119.5°$, assigned to diamond (004), was 340 arcsec (about 0.1°).

The etch-pit density was also evaluated. The surface of the diamond layer was subjected to plasma treatment under the conditions of $H_2$ gas 100 vol. %. 0.8 Pa, 2200 W, and 1 hour by using a microwave (2.45 GHz) plasma CVD apparatus. Then, the etch-pit densities were measured by SEM observation, and found that the both of the portion grown on the patterned diamond and the portion of the pattern gap showed $3\times10^6$ ($cm^{-2}$), that is, the etch-pit densities were low in the whole surface of the diamond substrate.

On SEM observation of the cross section of the substrate, a void having a nearly triangle shape cross-section with a side of 5 μm was observed also in the vicinity of the center of the portion where had been the second patterned gap, in such a way that it touched with the boundary between the Ir layer and the diamond layer.

In order to evaluate the stress of the diamond substrate, the (change of warpage of the back surface of the substrate)/(increment of the film thickness) before and after the formation of the diamond layer was measured to give the value of $15\times10^{-2}$.

Example 2

A diamond substrate was manufactured by the method shown in FIG. 1.

In the beginning, a double-side polished heteroepitaxial diamond substrate (freestanding substrate) 3 having a diameter of 5.0 mm and a thickness of 0.5 mm, with the surface having a (100) plane was prepared. This was cleaned with a thermal mixed acid, and used as a foundation 1 (FIG. 1 (*a*)).

Then, patterning was performed on the foundation 1 composed of diamond 3 by the same process as in Example 1. First, 1000 nm of $SiO_2$ film 7 was formed on the diamond substrate 3 by an RF plasma CVD method using tetraethyl orthosilicate (TEOS) as a raw material (FIG. 1 (*b*)). Onto this $SiO_2$ film 7, a resist pattern 8 was formed (FIG. 1 (*c*)). Subsequently, onto the $SiO_2$ film 7 on which the resist pattern 8 had been formed, a titanium (Ti) film and a gold (Au) film were formed successively and subjected to liftoff, thereby forming the $SiO_2$ film 7 and the titanium (Ti)/gold (Au) pattern 9 successively on the diamond substrate 3 (FIG. 1 (*d*)). Then, $SiO_2$ etching was performed by using $CF_4$ gas to make a hard mask for diamond etching (FIG. 1 (*e*)).

The diamond was etched under the conditions of $O_2$ gas 100 vol. %, 2.0 Pa, 500 W, and 900 seconds by using an induced combination plasma etching equipment to prepare the patterned diamond 2 on the foundation surface (FIG. 1 (*f*)). Incidentally, the procedures described to this part corresponds to the first step in the present invention.

In this case, the pattern shape was a pattern in which 50 μm square rectangular dot diamonds were arranged, and the width W of the pattern gap 10 was 70 μm. In other words, this was a pattern in which plural grooves were provided in parallel with each other on the diamond layer, and other plural grooves being in parallel with each other were provided perpendicular to the foregoing grooves. The directions of the grooves were two directions which were perpendicular with each other, and one of them was the same direction with the [011] orientation of the diamond layer.

The depth D of the pattern gap 10 was adjusted to 10 μm, and accordingly, the ratio (D/W) of the depth D to the width W of the pattern gap 10 was 0.14 in this case.

Then, the obtained patterned diamond 2 was cleaned by plasma treatment as the step 2 (FIG. 1 (*g*)). The treatment was performed under the conditions of $CF_4$ gas 100 vol. %, 2.0 Pa, 500 W, and 650 seconds by using an induced combination plasma etching equipment.

After the cleaning, the hard mask of $SiO_2$ was removed with buffered hydrofluoric acid, and cleaned with a thermal mixed acid (FIG. 1 (*h*)).

Next, as the third step, the diamond was grown from the patterned diamond 2, which had been prepared on the foundation surface, by a microwave plasma CVD method to form the diamond 11 in the pattern gap 10 of the patterned diamond 2 prepared in the first step (FIG. 1 (*i*)).

The substrate provided with the patterned diamond 2 was set inside a chamber of a microwave plasma CVD apparatus, and after exhausting was performed using a rotary pump and a turbo molecular pump until the pressure became $7\times10^{-8}$ Torr (about $9.3\times10^{-6}$ Pa), 500 sccm of hydrogen-diluted methane ($CH_4/(CH_4+H_2)=5.0$ vol. %) was introduced as a source gas. After the pressure inside the chamber became 110 Torr (about $1.5\times10^4$ Pa) by adjusting aperture of the valve connected to the exhaust system, film formation was performed for 15 hours by applying microwave power of 3000 W. The temperature of the substrate during film formation, which was measured by a pyrometer, was 1050° C.

In the obtained diamond layer, the pattern gaps were filled. In this case, the thickness from the foundation surface to the surface of the substrate was 78 μm. This diamond layer was measured by X-ray diffraction (an incident X-ray wavelength of 1.54 Å) to reveal that the rocking curve half value width of the diffracted intensity peak at 2θ=119.5°, assigned to diamond (004), was 340 arcsec (about 0.1°).

The etch-pit density was also evaluated. The surface of the diamond layer was subjected to plasma treatment under the conditions of $H_2$ gas 100 vol. %. 0.8 Pa, 2200 W, and 1 hour by using a microwave (2.45 GHz) plasma CVD apparatus. Then, the etch-pit densities were measured by SEM observation, and found that the portion grown on the patterned diamond showed $2\times10^8$ ($cm^{-2}$), on the other hand, the portion of the pattern gap showed $4\times10^6$ ($cm^{-2}$), that is, the etch-pit density was decreased about two orders of magnitude.

The cross section of the diamond substrate 12 was observed under SEM to reveal that the portions where had been pattern gaps were entirely filled. In order to evaluate the stress of the diamond substrate, the (change of warpage of the back surface of the substrate)/(increment of the film thickness) before and after the formation of the diamond layer was measured to give the value of $15\times10^{-2}$.

Then, the surface of the obtained diamond substrate 12 was polished. After the polishing, the thickness from the foundation surface to the surface of the substrate was 56 μm, and the surface roughness RMS was 0.3 nm (AFM measurement, in a region of 10 μm square).

Subsequently, the second patterning of the diamond layer was performed by the same process as in the first patterning. The pattern shape in this case was a pattern in which 50 μm square rectangular dot diamonds were arranged, and the width W of the pattern gap was 70 μm as in the shape of the first pattern. Provided that, the position of the pattern was translated in parallel along the [011] orientation of the diamond layer by 60 μm with respect to the first pattern. That is, in this case, the diamond formed in the second step was removed to a position which was 10 μm away from a boundary with the patterned diamond prepared in the first step.

Then, diamond was grown from the patterned diamond by the same method as in growing the diamond from the patterned diamond prepared on the foundation surface.

In the obtained diamond layer, the pattern gaps were filled. In this case, the thickness from the foundation surface to the surface of the substrate was 134 μm.

This diamond layer was measured by X-ray diffraction (an incident X-ray wavelength of 1.54 Å) to reveal that the rocking curve half value width of the diffracted intensity peak at 2θ=119.5°, assigned to diamond (004), was 340 arcsec (about 0.1°).

The etch-pit density was also evaluated. The surface of the diamond layer was subjected to plasma treatment under the conditions of $H_2$ gas 100 vol. %. 0.8 Pa, 2200 W, and 1 hour by using a microwave (2.45 GHz) plasma CVD apparatus. Then, the etch-pit densities were measured by SEM observation, and found that the portion grown on the patterned diamond showed $3\times10^6$ ($cm^{-2}$), and the portion of the pattern gap showed $4\times10^6$ ($cm^{-2}$), that is, the etch-pit densities were low in the whole surface of the diamond substrate.

The cross section of the substrate was observed under SEM to reveal that the portions where had been pattern gaps were entirely filled.

In order to evaluate the stress of the diamond substrate, the (change of warpage of the back surface of the substrate)/(increment of the film thickness) before and after the formation of the diamond layer was measured to give the value of $10\times10^{-2}$.

Example 3

A diamond substrate was manufactured by the method shown in FIG. 2.

First, a foundation 21 was manufactured, and a diamond layer 26 was formed onto the foundation 21 as follows (FIG. 2 (*a*)).

A double-side polished single crystal silicon (Si) substrate 23 having a diameter of 10.0 mm and a thickness of 1.0 mm, with the surface having a (100) plane, was prepared. On the one side of the prepared single crystal silicon substrate 23, a layer 24 composed of single crystal MgO was formed by electron beam deposition. In this case, the single crystal MgO layer 24 was epitaxially grown until the thickness reached to 1 μm under the conditions of 900° C. of the substrate temperature in vacuum. On this single crystal MgO layer 24, a layer 25 composed of Ir was formed. The Ir layer 25 was formed by using a radio-frequency (RF) magnetron sputtering method (13.56 MHz) with targeting at Ir having a diameter of 6 inches (150 mm), a thickness of 5.0 mm, and purity of 99.9% or higher.

The substrate on which the single crystal MgO layer 24 had been formed was heated to 800° C., and after it was confirmed that a base pressure became $6\times10^{-7}$ Torr (about $8.0\times10^{-5}$ Pa) or lower, 10 sccm of Ar gas was introduced. After the pressure became $5\times10^{-2}$ Torr (about 6.7 Pa) by adjusting aperture of a valve connected to an exhaust system, film formation was performed for 15 minutes by applying RF power of 1000 W. The obtained Ir layer 25 had a thickness of 0.7 μm.

Thus obtained laminate, in which the single crystal MgO layer 24 and the Ir layer 25 had been laminated on the single crystal silicon substrate 23, was used as the foundation 21 in Example 3.

Then, the foundation 21 was subjected to pre-treatment (bias treatment) in order to form diamond nuclei. The foundation 21 was set on a planar electrode having a diameter of 15 mm, with the Ir layer 25 side facing upwards. After it was confirmed that the base pressure became $1\times10^{-6}$ Torr (about $1.3\times10^{-4}$ Pa) or lower, 500 sccm of hydrogen-diluted methane ($CH_4/(CH_4+H_2)$=5.0 vol. %) was introduced. After the pressure became 100 Torr (about $1.3\times10^4$ Pa) by adjusting aperture of the valve connected to the exhaust system, a negative voltage was applied to an electrode at the substrate side to expose the foundation to plasma for 90 seconds, and thereby the foundation surface was subjected to bias treatment.

Subsequently, a diamond layer 26 was heteroepitaxially grown on the foundation surface using a direct current plasma CVD method. The bias-treated foundation was set inside a chamber of a direct current plasma CVD apparatus, and after exhausting was performed using a rotary pump until the base pressure became $10^{-3}$ Torr (about $1.3\times10^{-1}$ Pa) or lower, 1000 sccm of hydrogen-diluted methane ($CH_4/(CH_4+H_2)$=5.0 vol. %) was introduced as a source gas. After the pressure inside the chamber became 110 Torr (about $1.5\times10^4$ Pa) by adjusting aperture of the valve connected to the exhaust system, film formation was performed for 2 hours by sending a direct current of 2.0 A. The temperature of the foundation during film formation, which was measured by a pyrometer, was 950° C.

The obtained diamond layer 26 was a complete continuous film which did not have delamination on the whole surface of the substrate with a diameter of 10 mm, and had a film thickness of 10 μm. This diamond layer was measured by X-ray diffraction (an incident X-ray wavelength of 1.54 Å) to reveal that the rocking curve half value width of the diffracted intensity peak at 2θ=119.5°, assigned to diamond (004), was 720 arcsec (about 0.2°).

The etch-pit density was also evaluated. The surface of the diamond layer 26 was subjected to plasma treatment under the conditions of $H_2$ gas 100 vol. %. 0.8 Pa, 2200 W, and 1 hour by using a microwave (2.45 GHz) plasma CVD apparatus, and then the etch-pit density was measured by SEM observation to be $8\times10^8$ ($cm^{-2}$).

Then, the diamond layer 26 was subjected to patterning. First, 1000 nm of $SiO_2$ film 27 was formed on the diamond layer by an RF plasma CVD method using tetraethyl orthosilicate (TEOS) as a raw material (FIG. 2 (*b*)). Onto this $SiO_2$ film 27, a resist pattern 28 was formed (FIG. 2 (*c*)). Subsequently, onto the $SiO_2$ film 27 on which the resist pattern 28 had been formed, a titanium (Ti) film and a gold (Au) film were formed successively and subjected to liftoff, thereby forming the $SiO_2$ film 27 and the titanium (Ti)/gold (Au) pattern 29 successively on the diamond layer 26 (FIG. 2 (*d*)). Then, $SiO_2$ etching was performed by using $CF_4$ gas to make a hard mask for diamond etching (FIG. 2 (*e*)).

The diamond layer was etched under the conditions of $O_2$ gas 100 vol. %, 2.0 Pa, 500 W, and 900 seconds by using an induced combination plasma etching equipment to prepare the patterned diamond 22 on the surface of the foundation 21 (FIG. 2 (*f*)). Incidentally, the procedures described to this part corresponds to the first step in the present invention.

In this case, the pattern shape was a pattern in which 50 μm square rectangular dot diamonds were arranged, and the width W of the pattern gap 30 was 5 μm. In other words, this was a pattern in which plural grooves were provided in parallel with each other on the diamond layer, and other plural grooves being in parallel with each other were provided perpendicular to the foregoing grooves. The directions of the grooves were two directions which were perpendicular with each other, and one of them was the same direction with the [011] orientation of the diamond layer.

The depth D of the pattern gap 30 was 10 μm, and the ratio (D/W) of the depth D to the width W of the pattern gap 30 was 2.0 in this case. The bottom portion of the pattern gap 30 was in a state in which Ir of the foundation was exposed.

Figure 3:
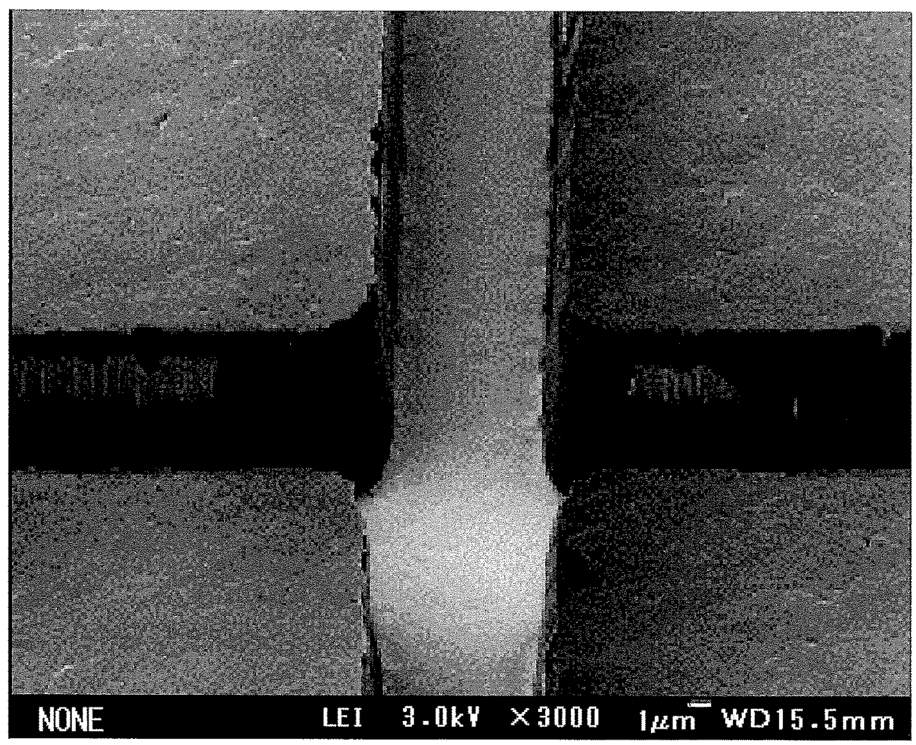
FIG. 3 is a SEM observation image which confirmed that foreign substances had adhered on the wall of the patterned diamond after the first step in Example 3.

The SEM observation image of the surface of this substrate is shown in FIG. 3. As shown in FIG. 3, it was observed that foreign substances had adhered on the wall of the patterned diamond 22.

Figure 4:
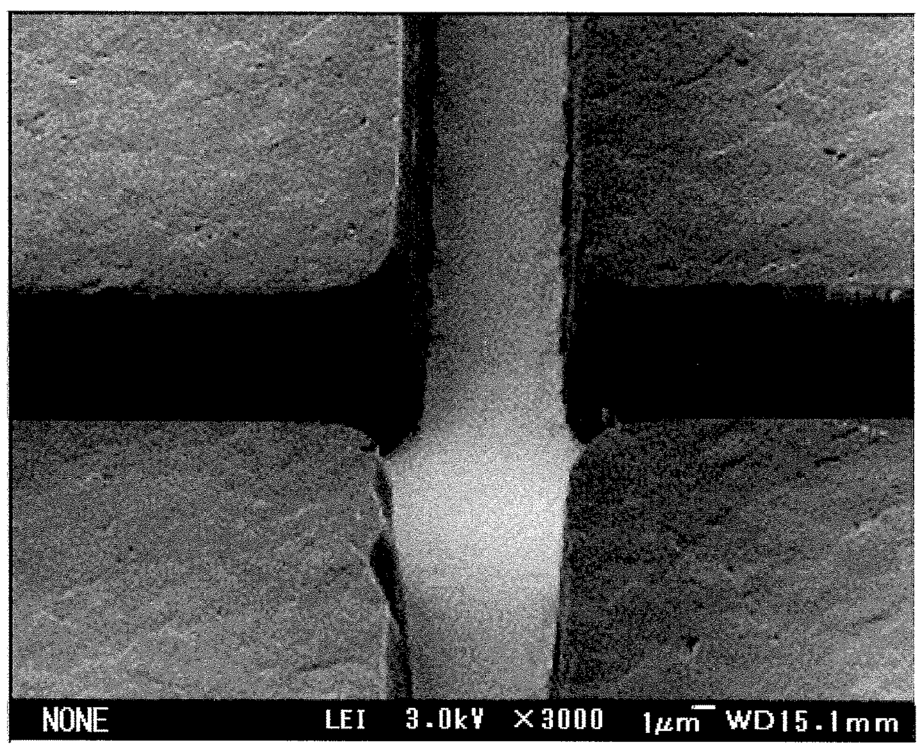
FIG. 4 is a SEM observation image which confirmed that the foreign substances on the wall of the patterned diamond had been removed after the second step in Example 3.

Then, the obtained patterned diamond 22 was cleaned by plasma treatment as the second step (FIG. 2 (*g*)). The treatment was performed under the conditions of $CF_4$ gas 100 vol. %, 2.0 Pa, 500 W, and 650 seconds by using an induced combination plasma etching equipment. This procedure could remove foreign substances probably due to Ir adhered on the wall of the patterned diamond. FIG. 4 shows a SEM observation image of the surface of the substrate after the cleaning. It was confirmed that the foreign substances were removed from the wall of the patterned diamond 22.

After the cleaning, the hard mask of $SiO_2$ was removed with buffered hydrofluoric acid, and cleaned with a thermal mixed acid (FIG. 2 (*h*)).

Next, as the third step, the diamond 31 was grown from the patterned diamond 22, which had been prepared on the foundation surface, by a microwave plasma CVD method (FIG. 2 (*i*)).

The substrate provided with the patterned diamond 22 was set inside a chamber of a microwave plasma CVD apparatus, and after exhausting was performed using a rotary pump and a turbo molecular pump until the pressure became $7\times10^{-8}$ Torr (about $9.3\times10^{-6}$ Pa), 500 sccm of hydrogen-diluted methane ($CH_4/(CH_4+H_2)$=5.0 vol. %) was introduced as a source gas. After the pressure inside the chamber became 110 Torr (about $1.5\times10^4$ Pa) by adjusting aperture of the valve connected to the exhaust system, film formation was performed for 18 hours by applying microwave power of 3000 W. The temperature of the substrate during film formation, which was measured by a pyrometer, was 1035° C.

Figures 5, 6:
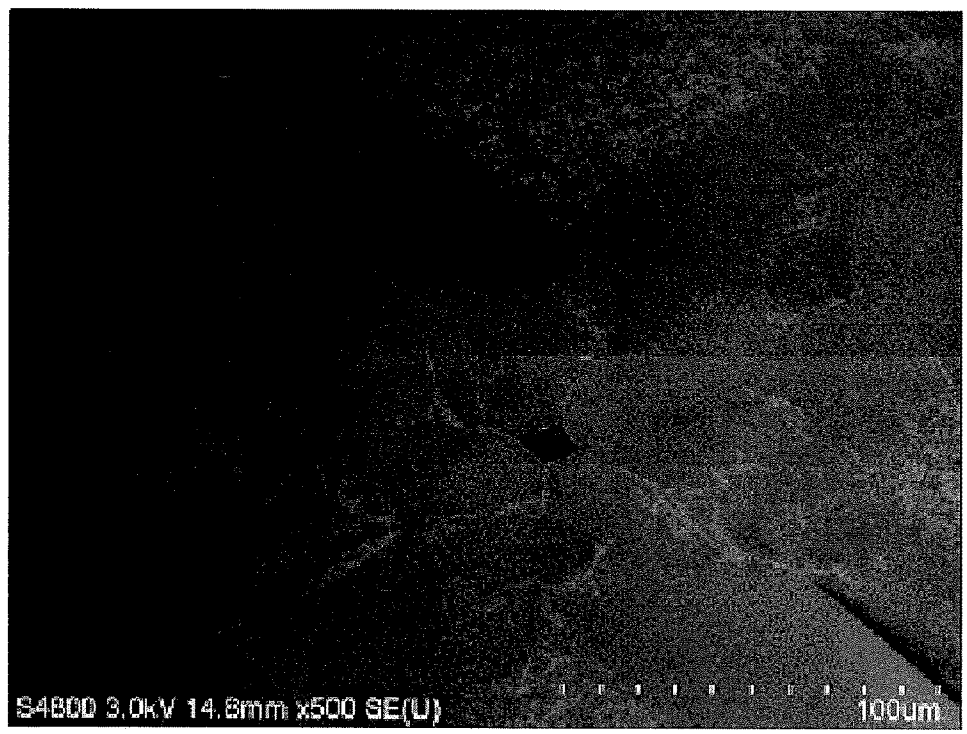
FIG. 5 is a SEM observation image of the surface of the diamond substrate produced in Example 3.
FIG. 6 is a SEM observation image of the surface of the diamond substrate produced in Comparative Example 1.

FIG. 5 shows a SEM observation image of the surface of the manufactured diamond substrate 32. In the obtained diamond layer, the pattern gaps were filled except in a part thereof. In this case, the thickness from the foundation surface to the surface of the substrate was 103 μm. This diamond layer was measured by X-ray diffraction (an incident X-ray wavelength of 1.54 Å) to reveal that the rocking curve half value width of the diffracted intensity peak at 2θ=119.5°, assigned to diamond (004), was 340 arcsec (about 0.1°).

The etch-pit density was also evaluated. The surface of the diamond layer was subjected to plasma treatment under the conditions of $H_2$ gas 100 vol. %. 0.8 Pa, 2200 W, and 1 hour by using a microwave (2.45 GHz) plasma CVD apparatus. Then, the etch-pit densities were measured by SEM observation, and found that the portion grown on the patterned diamond showed $1\times10^8$ ($cm^{-2}$), on the other hand, the portion of the pattern gap showed $4\times10^6$ ($cm^{-2}$), that is, the etch-pit density was decreased about two orders of magnitude.

On SEM observation of the cross section of the obtained diamond substrate 32, a void having a nearly triangle shape cross-section with a side of 3 μm was observed in the vicinity of the center of the portion where had been the patterned gap, in such a way that it touched with the boundary between the Ir layer and the diamond layer.

In order to evaluate the stress of the diamond substrate 32, the change of warpage of the back surface of the substrate before and after the formation of the diamond layer was measured by using an optical interference or a contact type measuring device.

Subsequently, this measured value was divided by an increment of the film thickness before and after the formation of the diamond layer, and the calculated value was defined to the evaluation value of stress of the diamond substrate. The evaluation value in this case was $30\times10^{-2}$.

Comparative Example 1

First, a double-side polished single crystal silicon (Si) substrate having a diameter of 10.0 mm and a thickness of 1.0 mm, with the surface having a (100) plane was prepared.

On the one side of the prepared single crystal silicon substrate, a layer composed of single crystal MgO was formed by electron beam deposition. In this case, the single crystal MgO layer was epitaxially grown until the thickness reached to 1 μm under the conditions of 900° C. of the substrate temperature in vacuum. On this single crystal MgO layer, a layer composed of Ir was formed. The Ir layer was formed by using a radio-frequency (RF) magnetron sputtering method (13.56 MHz) with targeting at Ir having a diameter of 6 inches (150 mm), a thickness of 5.0 mm, and purity of 99.9% or higher. The substrate on which the single crystal MgO layer had been formed was heated to 800° C., and after it was confirmed that a base pressure became $6\times10^{-7}$ Torr (about $8.0\times10^{-5}$ Pa) or lower, 10 sccm of Ar gas was introduced. After the pressure became $5\times10^{-2}$ Torr (about 6.7 Pa) by adjusting aperture of the valve connected to the exhaust system, film formation was performed for 15 minutes by applying RF power of 1000 W. The obtained Ir layer had a thickness of 0.7 μm.

Thus obtained laminate, in which the single crystal MgO layer and the Ir layer were laminated on the single crystal silicon substrate, was used as the foundation in Comparative Example 1.

Then, the foundation was subjected to pre-treatment (bias treatment) in order to form diamond nuclei. The foundation was set on a planar electrode having a diameter of 15 mm, with the Ir layer side facing upwards. After it was confirmed that the base pressure became $1\times10^{-6}$ Torr (about $1.3\times10^{-4}$ Pa) or lower, 500 sccm of hydrogen-diluted methane ($CH_4/(CH_4+H_2)$=5.0 vol. %) was introduced. After the pressure became 100 Torr (about $1.3\times10^{4}$ Pa) by adjusting aperture of the valve connected to the exhaust system, a negative voltage was applied to an electrode at the substrate side to expose the foundation to plasma for 90 seconds, and thereby the foundation surface was subjected to bias treatment.

Subsequently, a diamond layer was heteroepitaxially grown on the foundation surface using a direct current plasma CVD method. The bias-treated foundation was set inside a chamber of a direct current plasma CVD apparatus, and after exhausting was performed using a rotary pump until the base pressure became $10^{-3}$ Torr (about $1.3\times10^{-1}$ Pa) or lower, 1000 sccm of hydrogen-diluted methane ($CH_4/(CH_4+H_2)$=5.0 vol. %) was introduced as a source gas. After the pressure inside the chamber became 110 Torr (about $1.5\times10^{4}$ Pa) by adjusting aperture of the valve connected to the exhaust system, film formation was performed for 2 hours by sending a direct current of 2.0 A. The temperature of the foundation during film formation, which was measured by a pyrometer, was 950° C.

The obtained diamond layer was a complete continuous film which did not have delamination on the whole surface of the substrate with a diameter of 10 mm, and had a film thickness of 10 μm. This diamond layer was measured by X-ray diffraction (an incident X-ray wavelength of 1.54 Å) to reveal that the rocking curve half value width of the diffracted intensity peak at 2θ=119.5°, assigned to diamond (004), was 720 arcsec (about 0.2°).

The etch-pit density was also evaluated. The surface of the diamond layer was subjected to plasma treatment under the conditions of $H_2$ gas 100 vol. %. 0.8 Pa, 2200 W, and 1 hour by using a microwave (2.45 GHz) plasma CVD apparatus, and then the etch-pit density was measured by SEM observation to be $8\times10^{8}$ ($cm^{-2}$).

Then, the diamond layer was subjected to patterning. First, 1000 nm of $SiO_2$ film was formed on the diamond layer by an RF plasma CVD method using tetraethyl orthosilicate (TEOS) as a raw material. This $SiO_2$ film was subjected to a resist patterning and $SiO_2$ etching to be a hard mask for diamond etching.

The diamond layer was etched under the conditions of $O_2$ gas 100 vol. %, 2.0 Pa, 500 W, and 900 seconds by using an induced combination plasma etching equipment.

In this case, the pattern shape was a pattern in which 50 μm square rectangular dot diamonds were arranged, and the width W of the pattern gap was 70 μm. In other words, this was a pattern in which plural grooves were provided in parallel with each other on the diamond layer, and other plural grooves being in parallel with each other were provided perpendicular to the foregoing grooves. The directions of the grooves were two directions which were perpendicular with each other, and one of them was the same direction with the [011] orientation of the diamond layer.

The depth D of the pattern gap was 10 μm, and the ratio (D/W) of the depth D to the width W of the pattern gap was 0.14 in this case. The bottom portion of the pattern gap was in a state in which Ir of the foundation was exposed.

In Comparative Example 1, cleaning by plasma treatment was not performed, and foreign substances probably due to Ir were observed on the wall of the patterned diamond.

The hard mask of $SiO_2$ was removed with buffered hydrofluoric acid. A patterned diamond was prepared on the foundation surface through cleaning with a thermal mixed acid.

Next, the diamond was grown from the patterned diamond, which had been prepared on the foundation surface, by a microwave plasma CVD method. The substrate provided with the patterned diamond was set inside a chamber of a microwave plasma CVD apparatus, and after exhausting was performed using a rotary pump and a turbo molecular pump until the pressure became $7\times10^{-8}$ Torr (about $9.3\times10^{-6}$ Pa), 500 sccm of hydrogen-diluted methane ($CH_4/(CH_4+H_2)$=5.0 vol. %) was introduced as a source gas. After the pressure inside the chamber became 110 Torr (about $1.5\times10^{4}$ Pa) by adjusting aperture of the valve connected to the exhaust system, film formation was performed for 18 hours by applying microwave power of 3000 W. The temperature of the substrate during film formation, which was measured by a pyrometer, was 1035° C.

As shown in a SEM observation image (FIG. 6) of the surface of the obtained diamond substrate, the whole surface was covered with polycrystals.

On the basis of the foregoing results, it is revealed that the inventive method for manufacturing a diamond substrate can manufacture a diamond substrate with suppressing generation of abnormal growth particles, and can give a diamond substrate with few defects.

It should be noted that the present invention is not limited to the above-described embodiments. The above-described embodiments are described for illustrative purposes, and those having substantially the same configuration and those providing the same operational advantage as the technical concept described in the claims of the present invention are all encompassed in the technical scope of the present invention.

The invention claimed is:

1. A method for manufacturing a diamond substrate, comprising:

a first step of preparing patterned diamond by growing diamond on a surface of a foundation, the surface being composed of a different material other than diamond, and processing the grown diamond to have a patterned shape, wherein a bottom portion of a pattern gap of the patterned diamond is composed of a different material or at least a part of the bottom portion of the pattern gap is pierced through, a second step of removing a foreign substance other than diamond adhered on a side wall of a pattern of the patterned diamond prepared in the first step, and a third step of growing diamond from the patterned diamond prepared in the first step to form the diamond in the pattern gap of the patterned diamond prepared in the first step.

2. The method for manufacturing a diamond substrate according to claim 1, wherein the foreign substance adhered on the wall of the patterned diamond is removed by using $CF_4$ plasma in the second step.

3. The method for manufacturing a diamond substrate according to claim 1, wherein the patterned diamond is prepared in the first step with a ratio D/W of a depth D to a width W of the pattern gap being 0.1 or more.

4. The method for manufacturing a diamond substrate according to claim 1, wherein the patterned diamond is prepared in the first step with at least a part of a bottom portion of the pattern gap being prepared below the foundation surface.

5. The method for manufacturing a diamond substrate according to claim 1, wherein the diamond is grown by using a chemical vapor deposition method in the third step.

6. The method for manufacturing a diamond substrate according to claim 1, wherein a void is formed in the diamond grown in the third step.

7. The method for manufacturing a diamond substrate according to claim 5, wherein a void is formed in the diamond grown in the third step.

* * * * *